(12) United States Patent
Liu et al.

(10) Patent No.: US 6,421,783 B1
(45) Date of Patent: Jul. 16, 2002

(54) MICROPROCESSOR AND MAIN BOARD MOUNTING ARRANGEMENT

(75) Inventors: Chih-Wen Liu; Chih-Chuan Chang; Yue-Jen Yang, all of Taipei; Pao Chang Lin; Chih-Chung Cheng, both of Taipei Hsien, all of (TW)

(73) Assignee: Clevo Co., Taipei Hsien (TW)

( * ) Notice: Subject to any disclaimer, the term of this patent is extended or adjusted under 35 U.S.C. 154(b) by 0 days.

(21) Appl. No.: 09/321,109

(22) Filed: May 27, 1999

(30) Foreign Application Priority Data

Apr. 3, 1999 (TW) ..................................... 88205178 U

(51) Int. Cl.⁷ ............................................. G06F 13/00
(52) U.S. Cl. ..................... 713/300; 710/62; 710/300; 710/301; 361/790
(58) Field of Search ................. 710/62, 300, 301, 710/102; 361/790; 713/500, 300–340

(56) References Cited

U.S. PATENT DOCUMENTS

| | | | | |
|---|---|---|---|---|
| 5,644,760 A | * | 7/1997 | Polzin et al. ............... | 713/500 |
| 5,675,772 A | * | 10/1997 | Liu et al. ................... | 395/500 |
| 5,982,635 A | * | 11/1999 | Menzies et al. ............ | 361/790 |
| 5,983,297 A | * | 11/1999 | Noble et al. ............... | 710/102 |
| 6,041,372 A | * | 3/2000 | Hart et al. .................. | 710/62 |

* cited by examiner

Primary Examiner—Rupal Dharia
(74) Attorney, Agent, or Firm—Rosenberg, Klein & Lee

(57) ABSTRACT

A microprocessor and main board mounting arrangement, which includes a computer main board, at least one socket respectively mounted on the computer main board, at least one microprocessor adapter respectively mounted on the at least one socket, said at least one microprocessor adapter each holding a respective microprocessor, for example, a Desktop Celeron CPU, a Mobile Celeron or Mobile Pentium II CPU, for enabling the respective microprocessor to be electrically connected to the computer main board, each microprocessor adapter having a voltage converter for converting output power supply of the computer main board into the necessary working voltage for the microprocessor.

6 Claims, 25 Drawing Sheets

| | | |
|---|---|---|
| D#0 | W1 | HD#0 |
| D#1 | T4 | HD#1 |
| D#2 | N1 | HD#2 |
| D#3 | M6 | HD#3 |
| D#4 | U1 | HD#4 |
| D#5 | S3 | HD#5 |
| D#6 | T6 | HD#6 |
| D#7 | J1 | HD#7 |
| D#8 | S1 | HD#8 |
| D#9 | P6 | HD#9 |
| D#10 | Q3 | HD#10 |
| D#11 | M4 | HD#11 |
| D#12 | Q1 | HD#12 |
| D#13 | L1 | HD#13 |
| D#14 | N3 | HD#14 |
| D#15 | U3 | HD#15 |
| D#16 | H4 | HD#16 |
| D#17 | R4 | HD#17 |
| D#18 | P4 | HD#18 |
| D#19 | H6 | HD#19 |
| D#20 | L3 | HD#20 |
| D#21 | G1 | HD#21 |
| D#22 | F8 | HD#22 |
| D#23 | G3 | HD#23 |
| D#24 | K6 | HD#24 |
| D#25 | E3 | HD#25 |
| D#26 | E1 | HD#26 |
| D#27 | F12 | HD#27 |
| D#28 | A5 | HD#28 |
| D#29 | A3 | HD#29 |
| D#30 | J3 | HD#30 |
| D#31 | C5 | HD#31 |
| D#32 | F6 | HD#32 |
| D#33 | C1 | HD#33 |
| D#34 | C7 | HD#34 |
| D#35 | B2 | HD#35 |
| D#36 | C9 | HD#36 |
| D#37 | A9 | HD#37 |
| D#38 | D8 | HD#38 |
| D#39 | D10 | HD#39 |
| D#40 | C15 | HD#40 |
| D#41 | D14 | HD#41 |
| D#42 | D12 | HD#42 |
| D#43 | A7 | HD#43 |
| D#44 | A11 | HD#44 |
| D#45 | C11 | HD#45 |
| D#46 | A21 | HD#46 |
| D#47 | A15 | HD#47 |

SOCKET 371_B

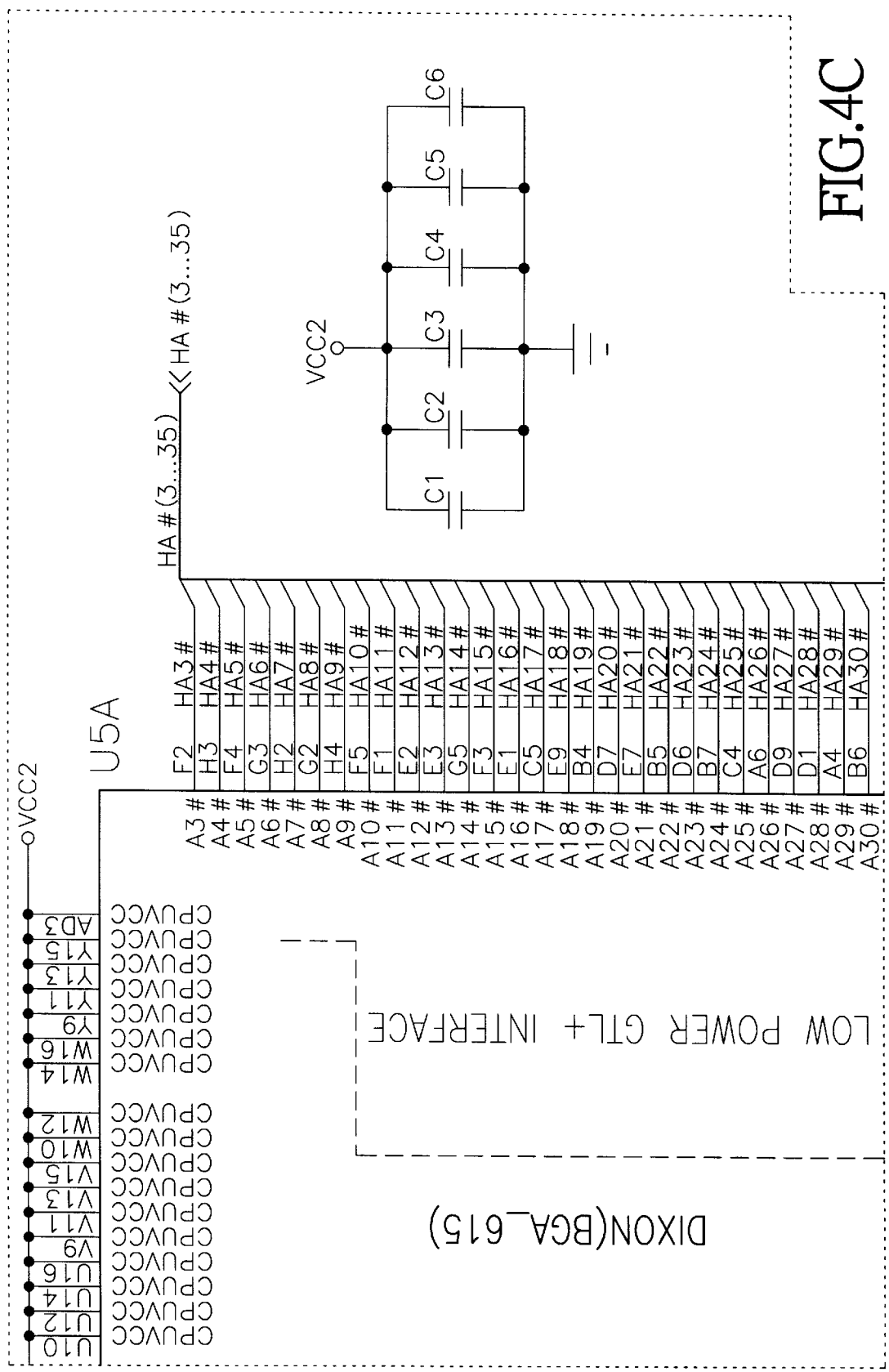

DIXON(BGA_615)

Top pins (left to right): W19, W20, Y6, Y7, Y8, Y17, Y18, Y19, Y20, Y21, AA5, AA6, AA7, AA8, AA9, AA10, AA11, AA12, AA13, AA14, AA15, AA16, AA17, AA18, AA19, AA20, AA21, AA22, AA23, AB3 — all NC Bottom pins (left to right): F12, F13, F14, F15, F16, F17, F18, F19, F23, G6, G7, G8, G17, G18, G19, G23, H6, H7, H8, H17, H18, H19, J6, J7, J8, J17, J18, J19, K6, K7 — all NC

MICROPROCESSOR AND MAIN BOARD MOUNTING ARRANGEMENT

BACKGROUND OF THE INVENTION

The present invention relates to a microprocessor and main board mounting arrangement, which enables a computer main board to simultaneously support different microprocessors including Mobile Celeron, Mobile Pentium II, and Desktop Celeron CPUs.

Among Intel's mobile CPUs (Central Processing Units), Celeron series and Pentium II are made by means of BGA (Ball Grid Array) techniques. These BGA type CPUs cannot be installed in the computer main board by means of a socket, and must be directly fastened to the computer main board by means of SMT (surface mounting techniques). Therefore, different computer main boards must be used with different CPUs. Further, "Socket 370", designed for use with (Desktop) Celeron series CPUs of speed over 300 MHz, is not compatible with Pentium II.

SUMMARY OF THE INVENTION

The present invention has been accomplished under the circumstances in view. It is the main object of the present invention to provide a microprocessor and main board mounting arrangement, which enables a computer main board to simultaneously support Intel's Mobile Celeron, Mobile Pentium II, and Desktop Celeron series. According to the present invention, the arrangement comprises a socket, e.g., a 370-pin Pin Grid Array, or PGA, socket mounted on a computer main board, and an adapter mounted on the socket to hold a CPU, enabling the CPU to be electrically connected to the computer main board. The adapter has a voltage converter for converting the output power supply of the computer main board into the necessary working voltage for the CPU.

BRIEF DESCRIPTION OF THE DRAWINGS

FIGS. 3A–3H is a circuit diagram of a socket for the microprocessor and main board mounting arrangement according to the present invention.

FIGS. 4A–4H is a circuit diagram of a microprocessor for the microprocessor and main board mounting arrangement according to the present invention.

Figure 5A:
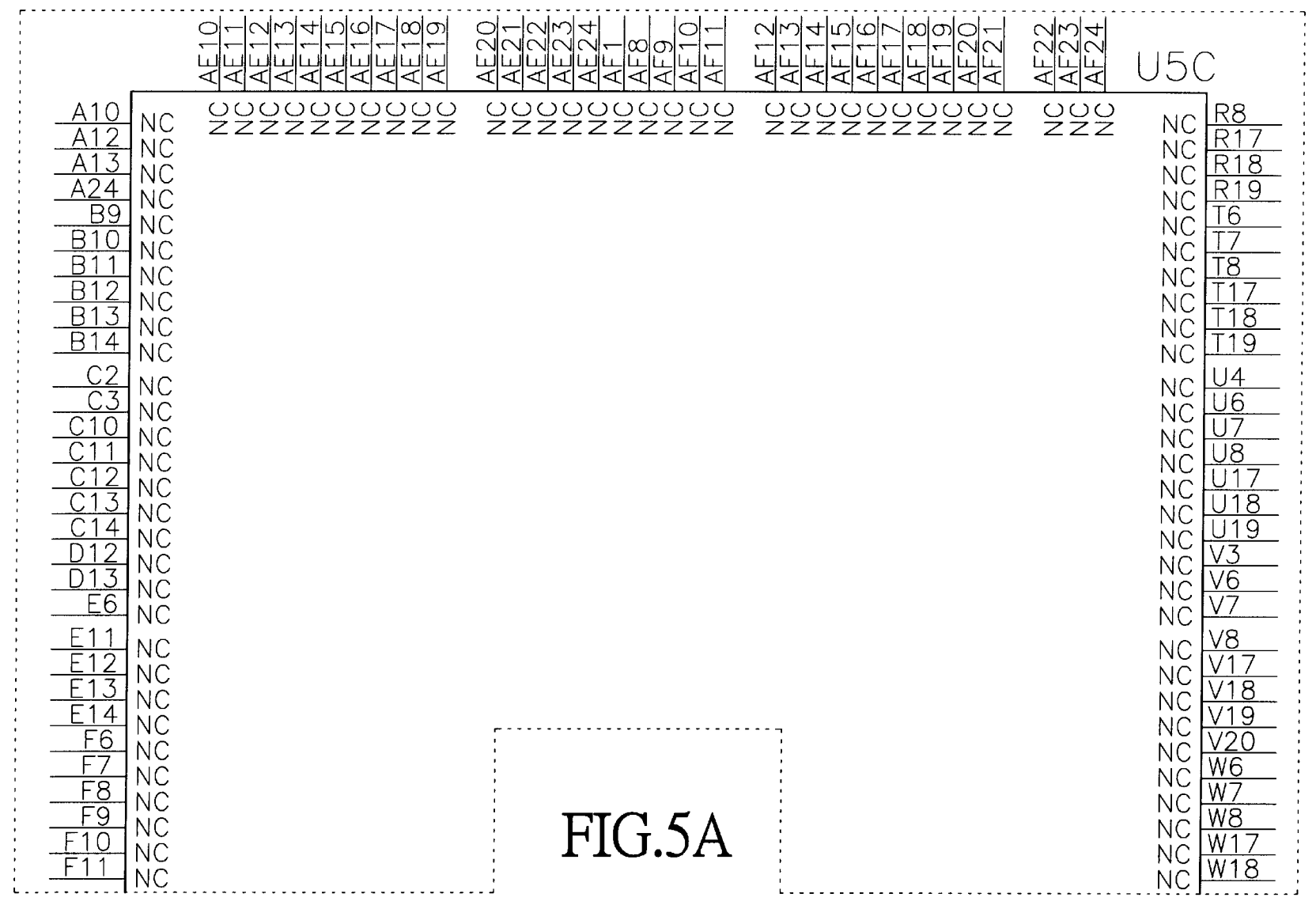

FIGS. 5A–5F is a circuit diagram of another microprocessor for the microprocessor and main board mounting arrangement according to the present invention.

DETAILED DESCRIPTION OF THE PREFERRED EMBODIMENT

Figure 1:
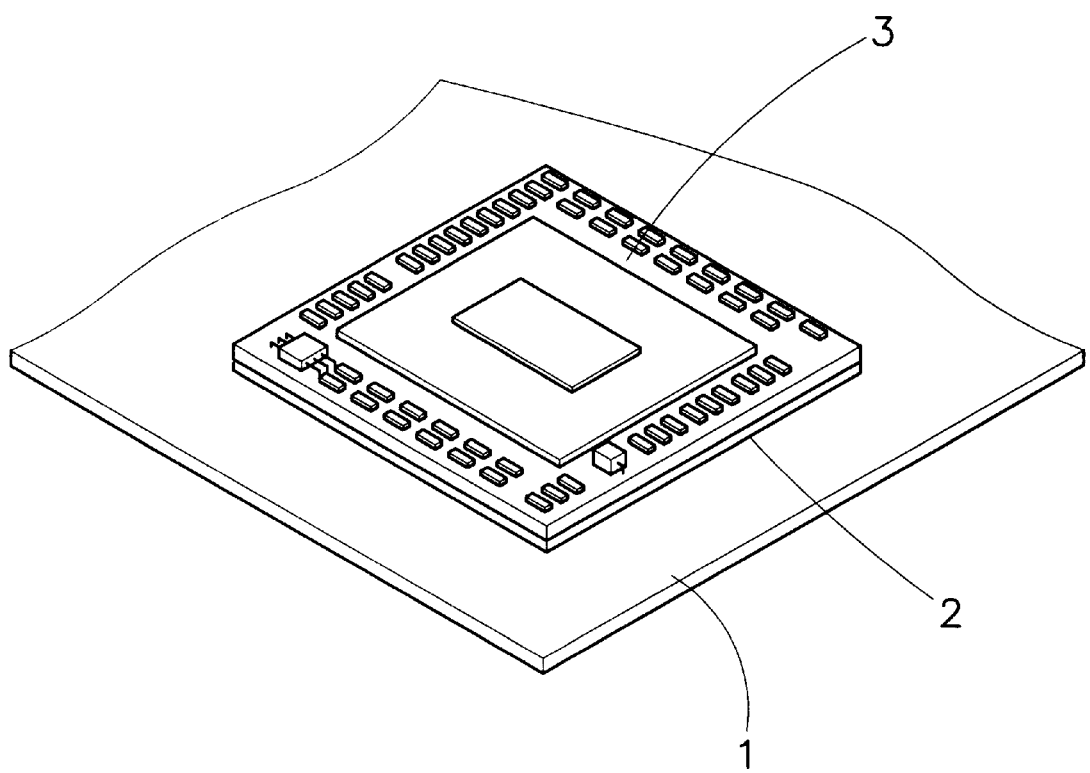
FIG. 1 is an installed view of a microprocessor and main board mounting arrangement according to one embodiment of the present invention.
Figure 2:
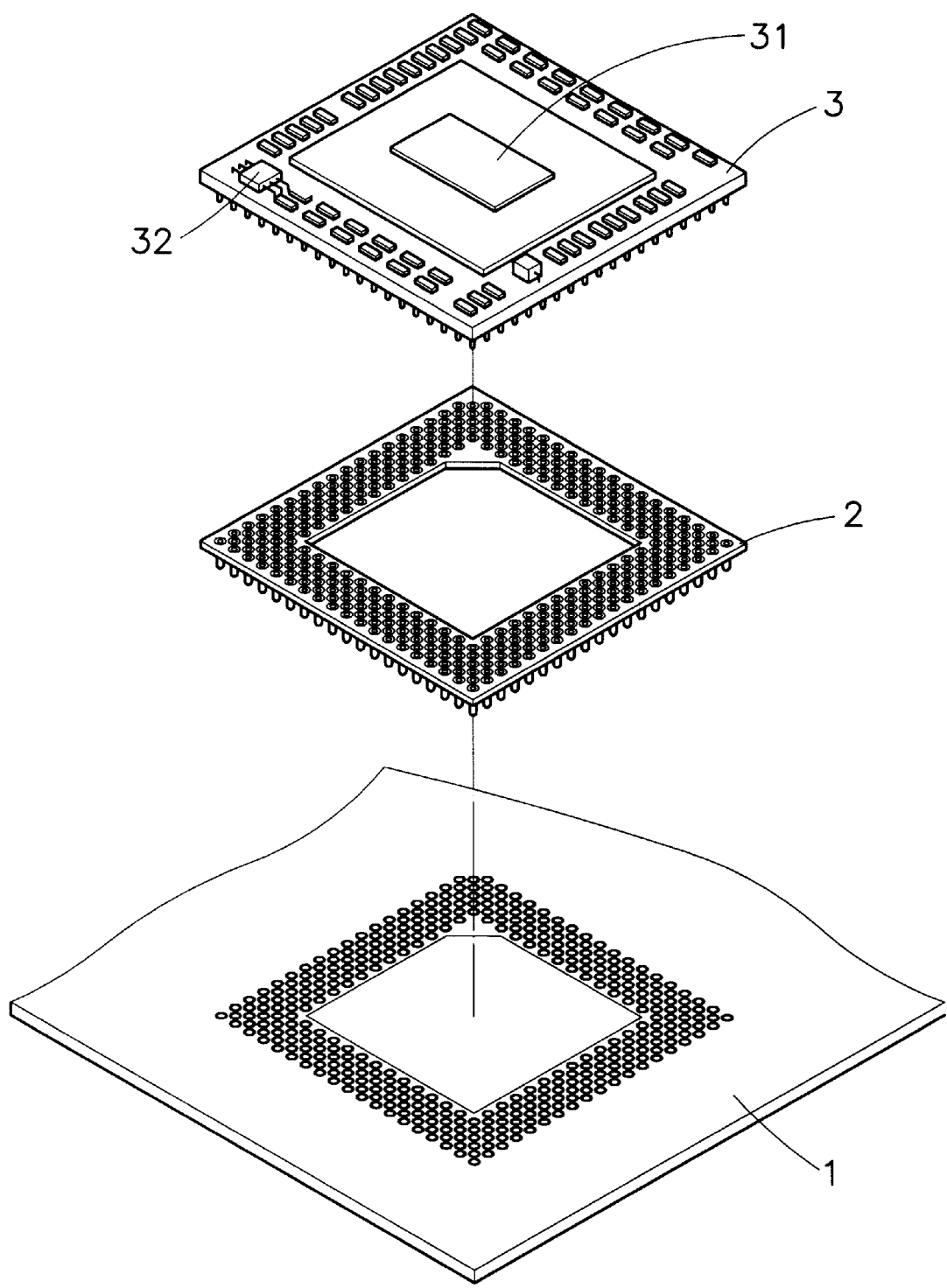
FIG. 2 is an exploded view of the embodiment shown in FIG. 1.
Figure 3A:
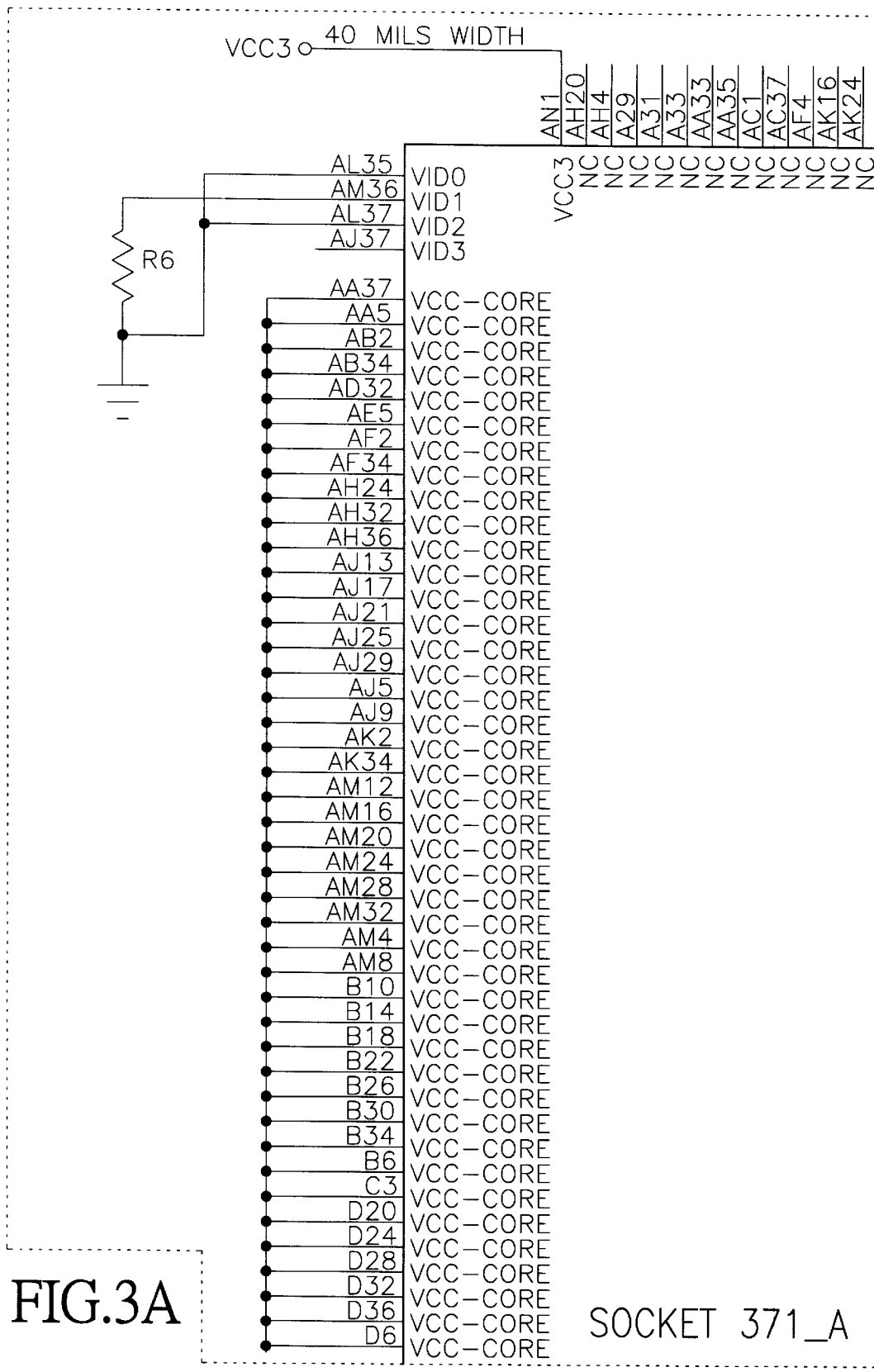
Figure 3B:
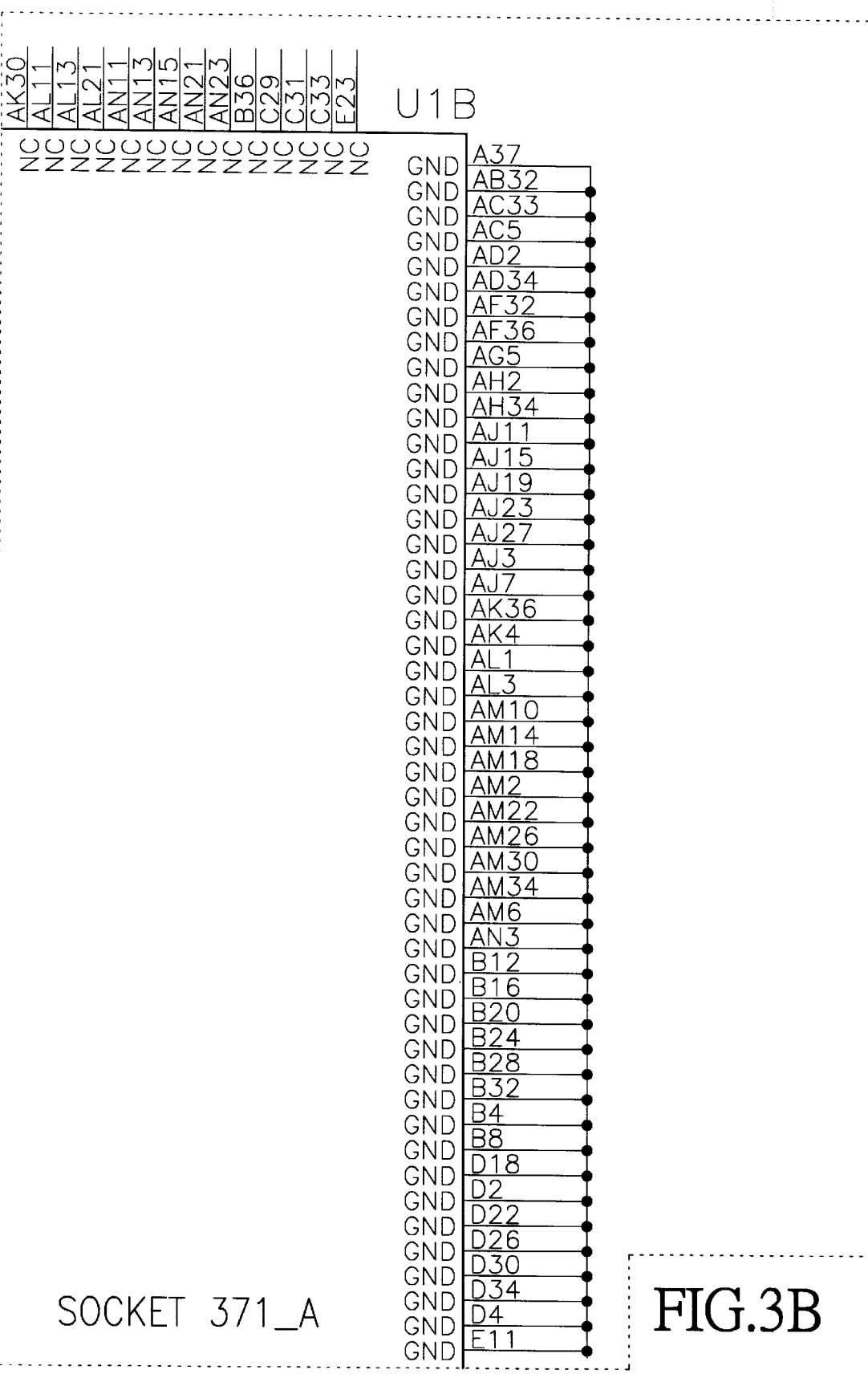
Figure 3C:
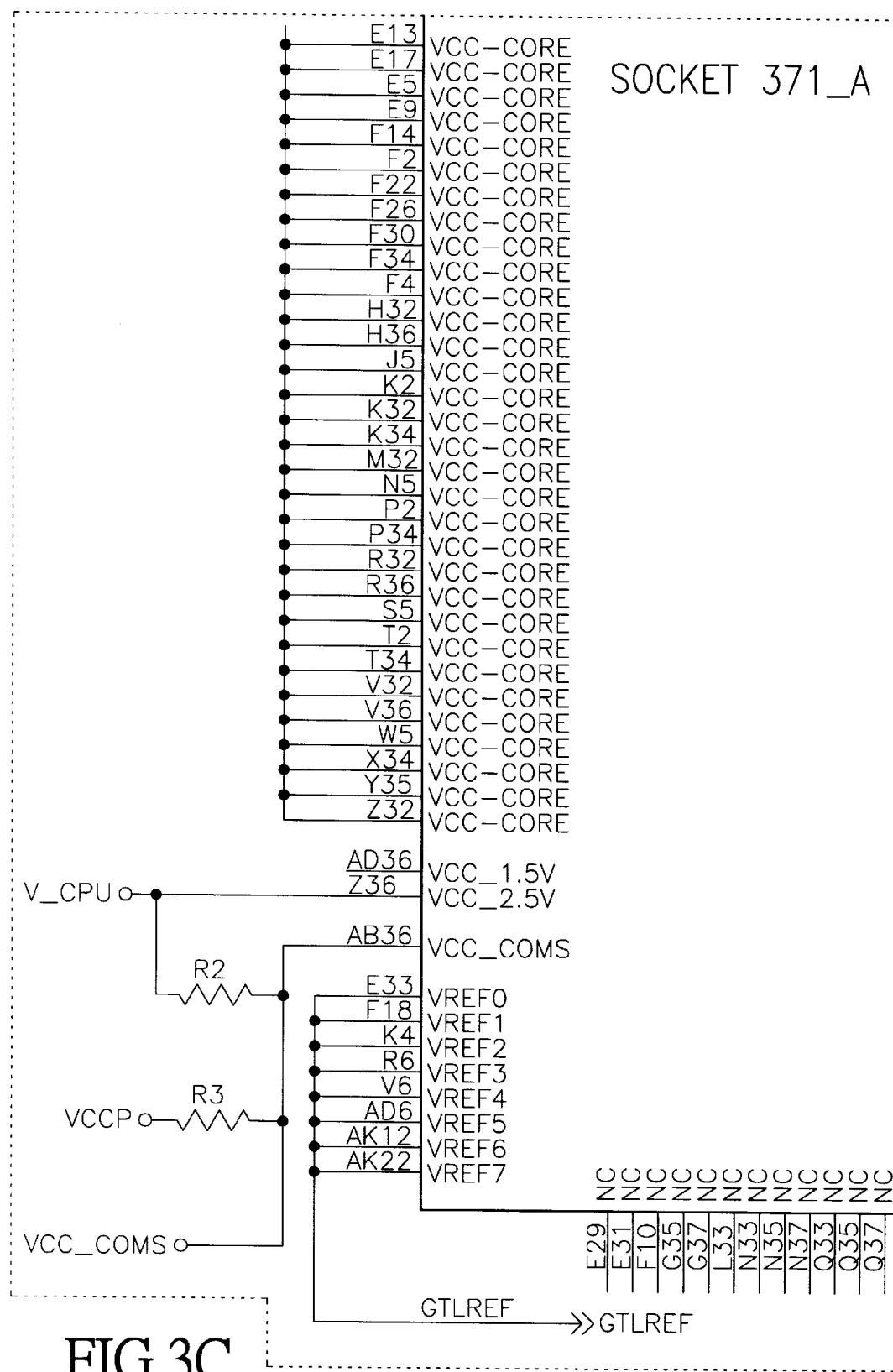
Figure 3D:
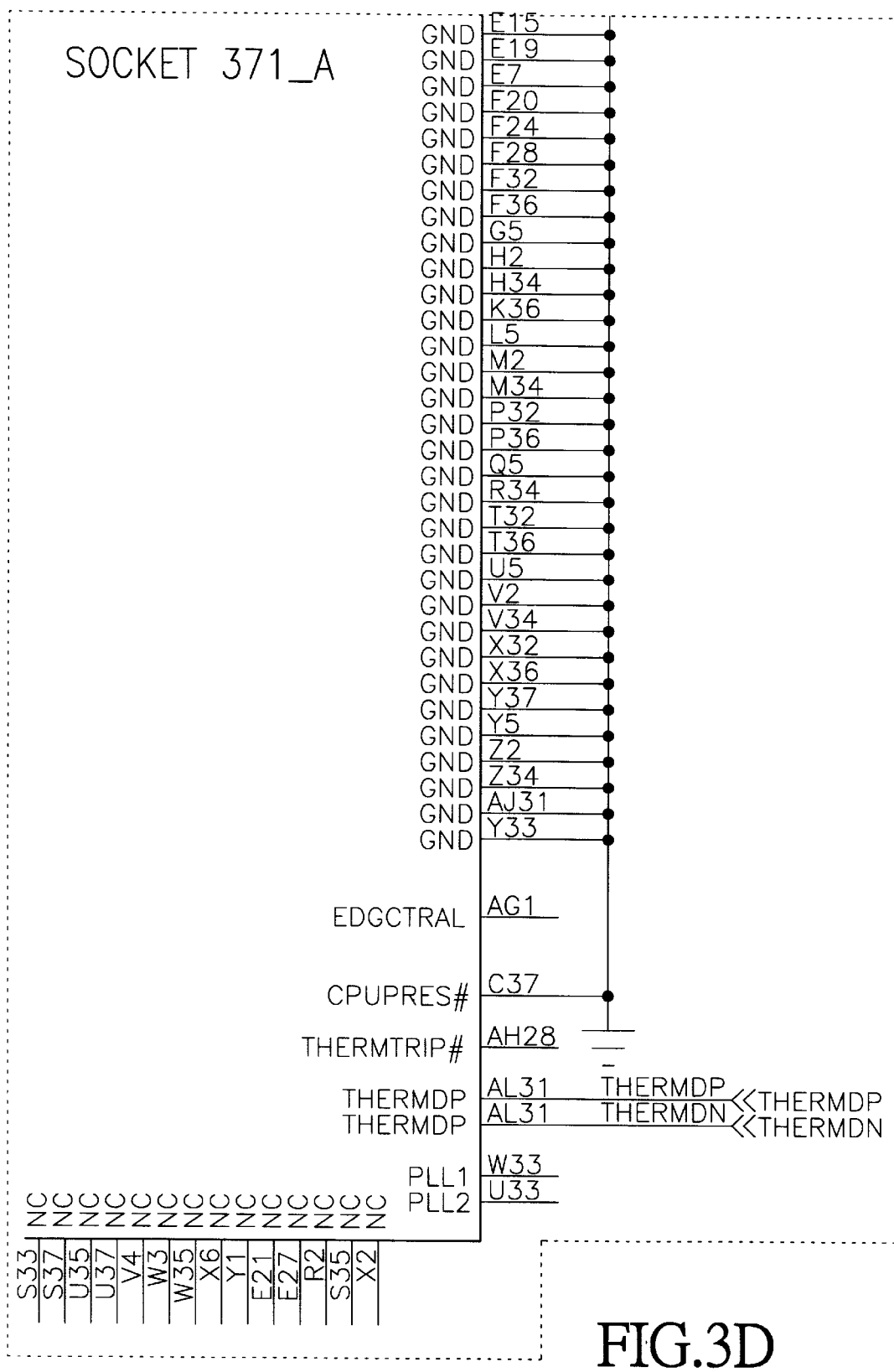
Figure 3E:
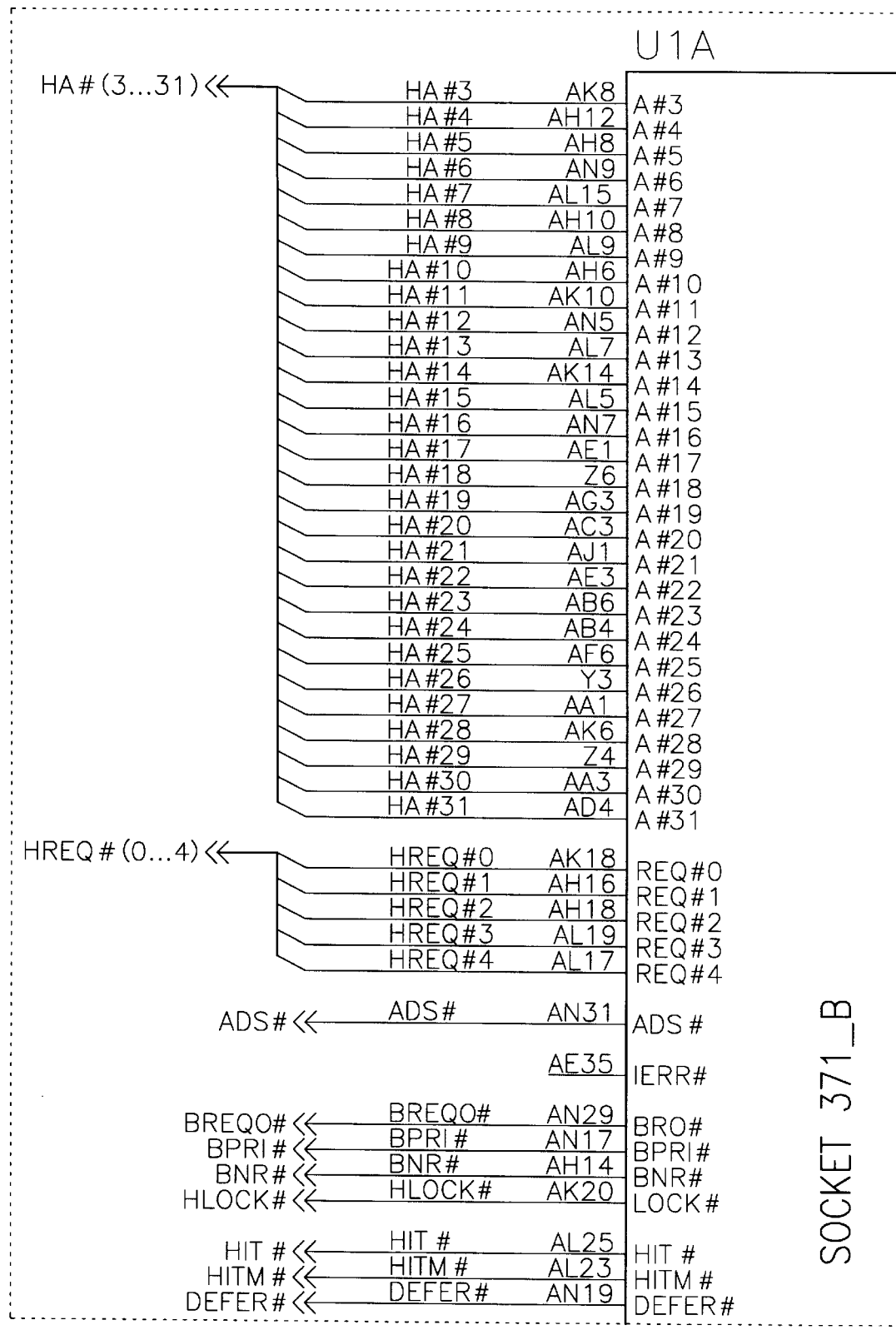
Figure 3G:
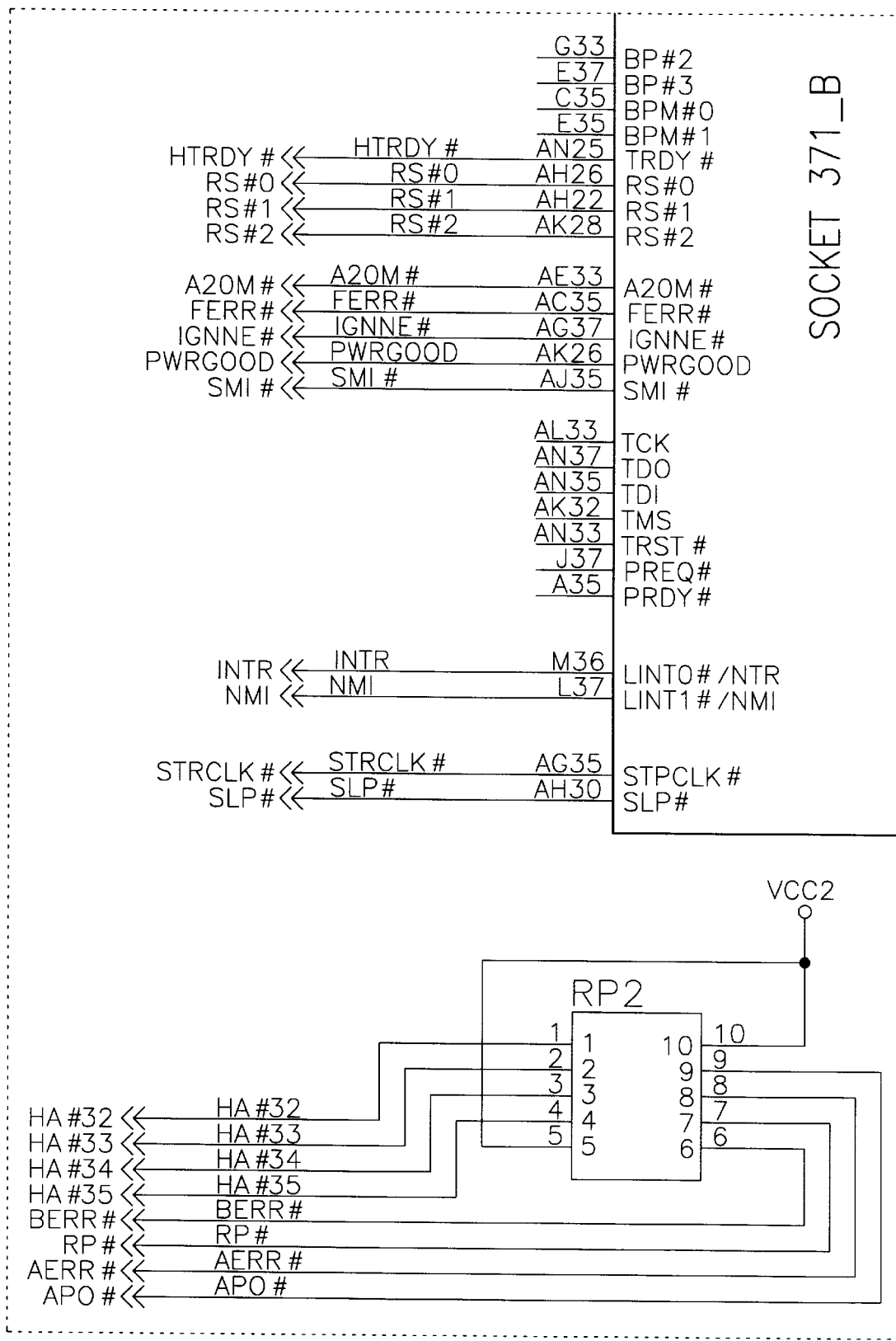
Figure 3H:
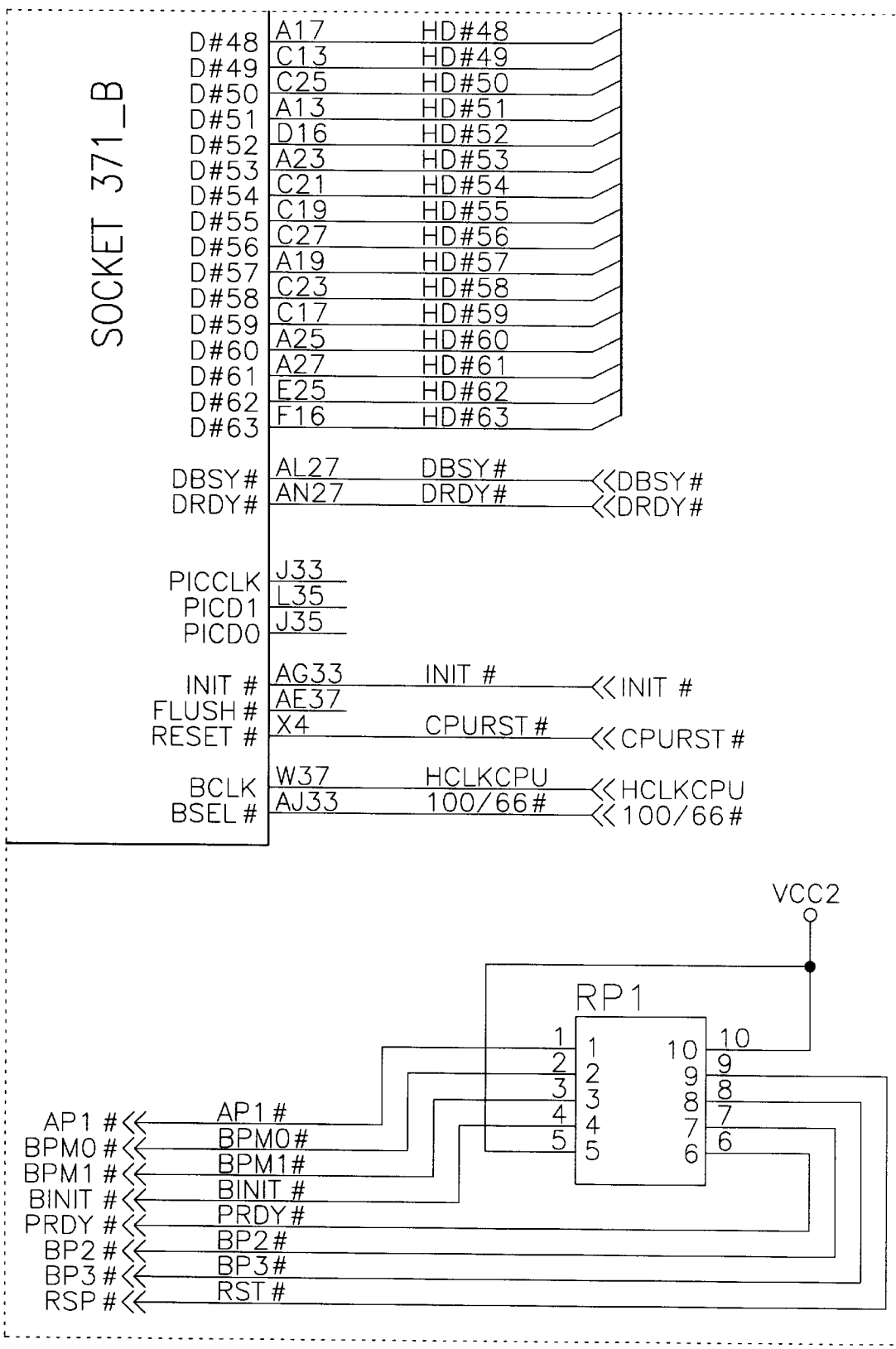
Figure 4A:
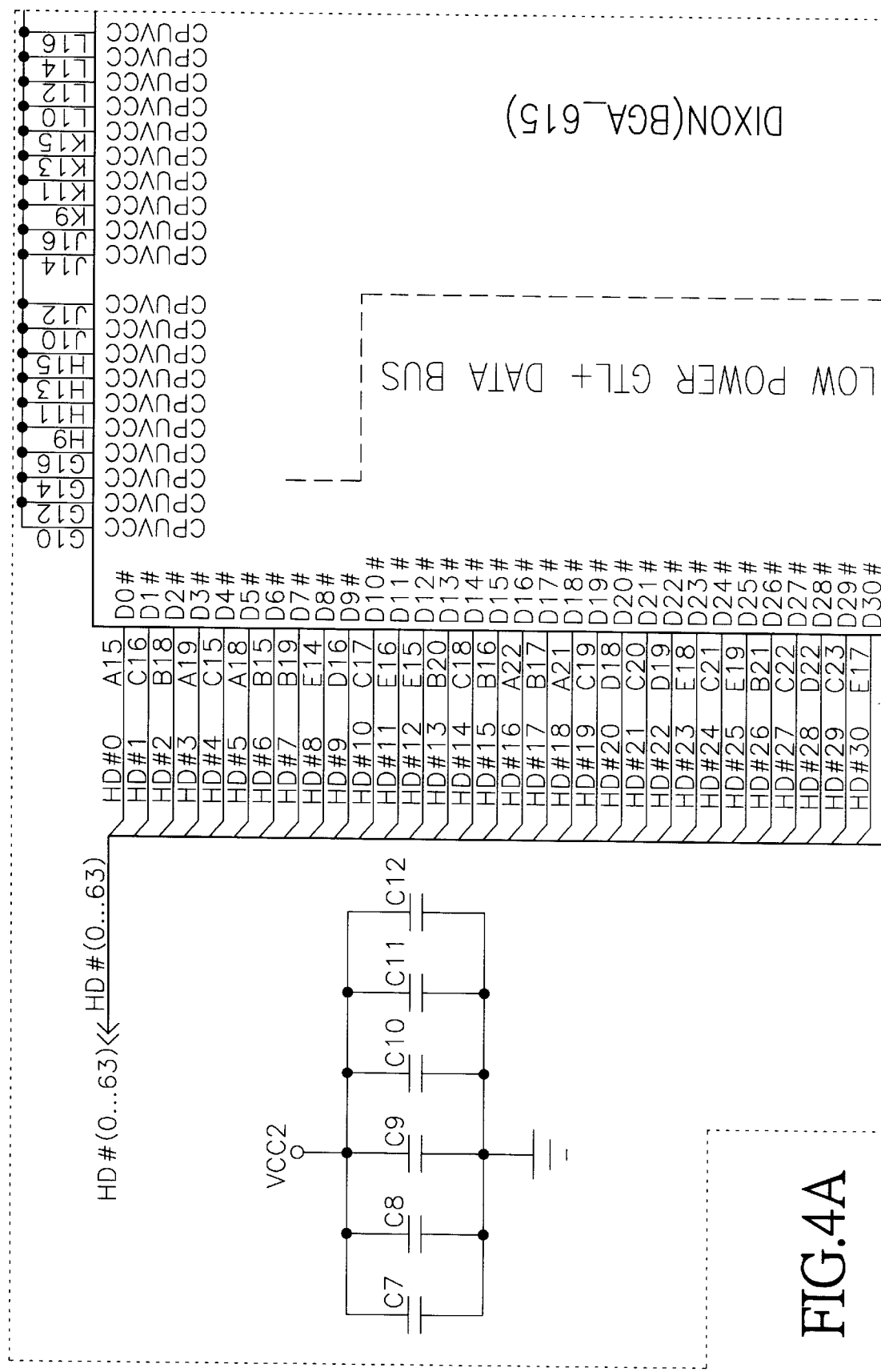
Figure 4B:
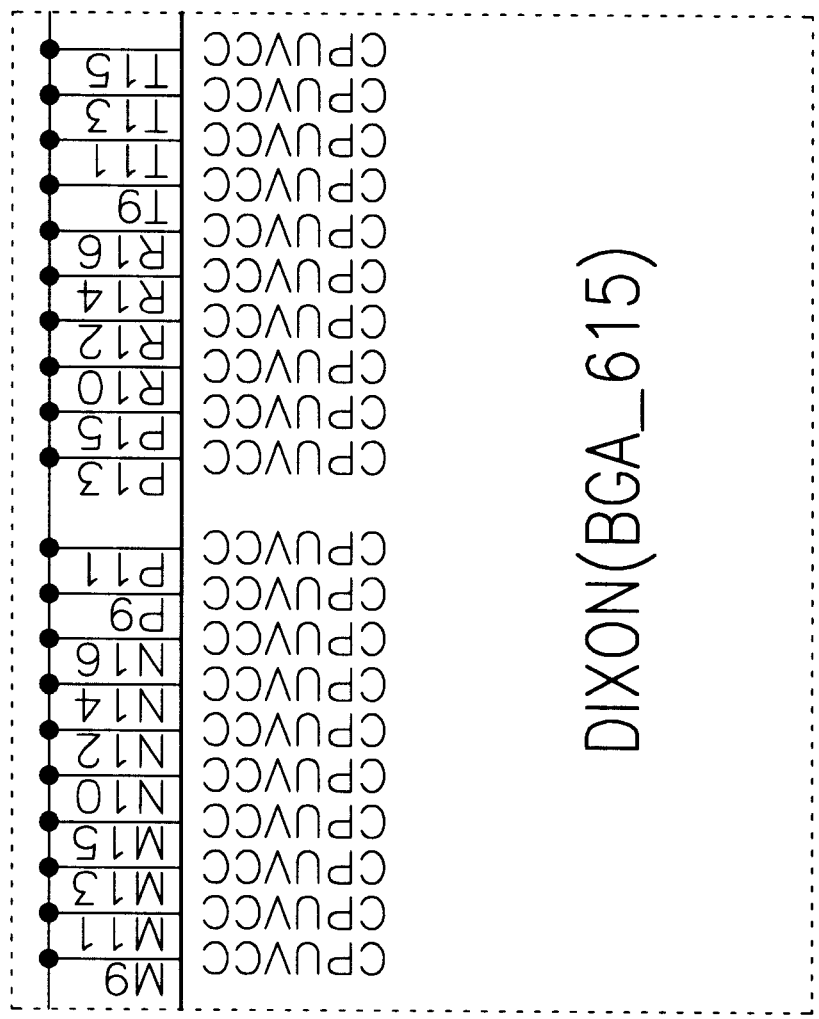
Figure 4D:
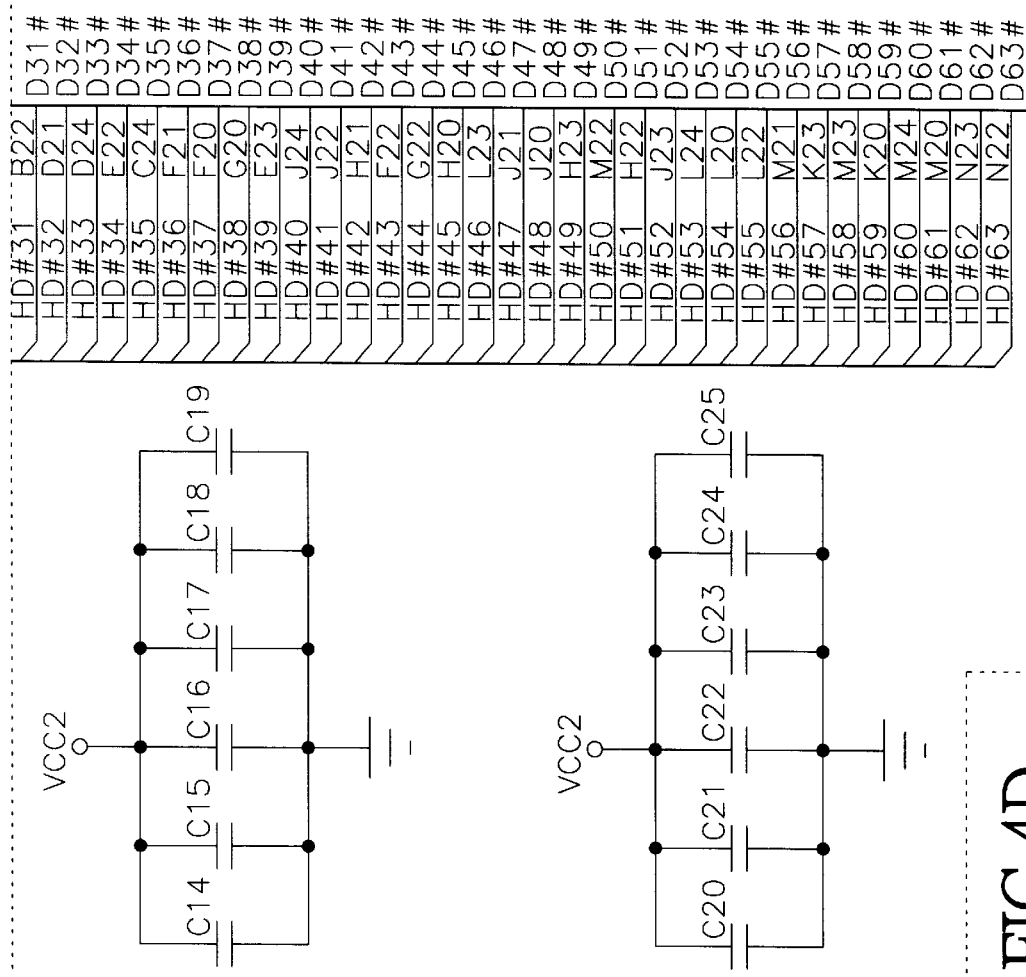
Figure 4E:
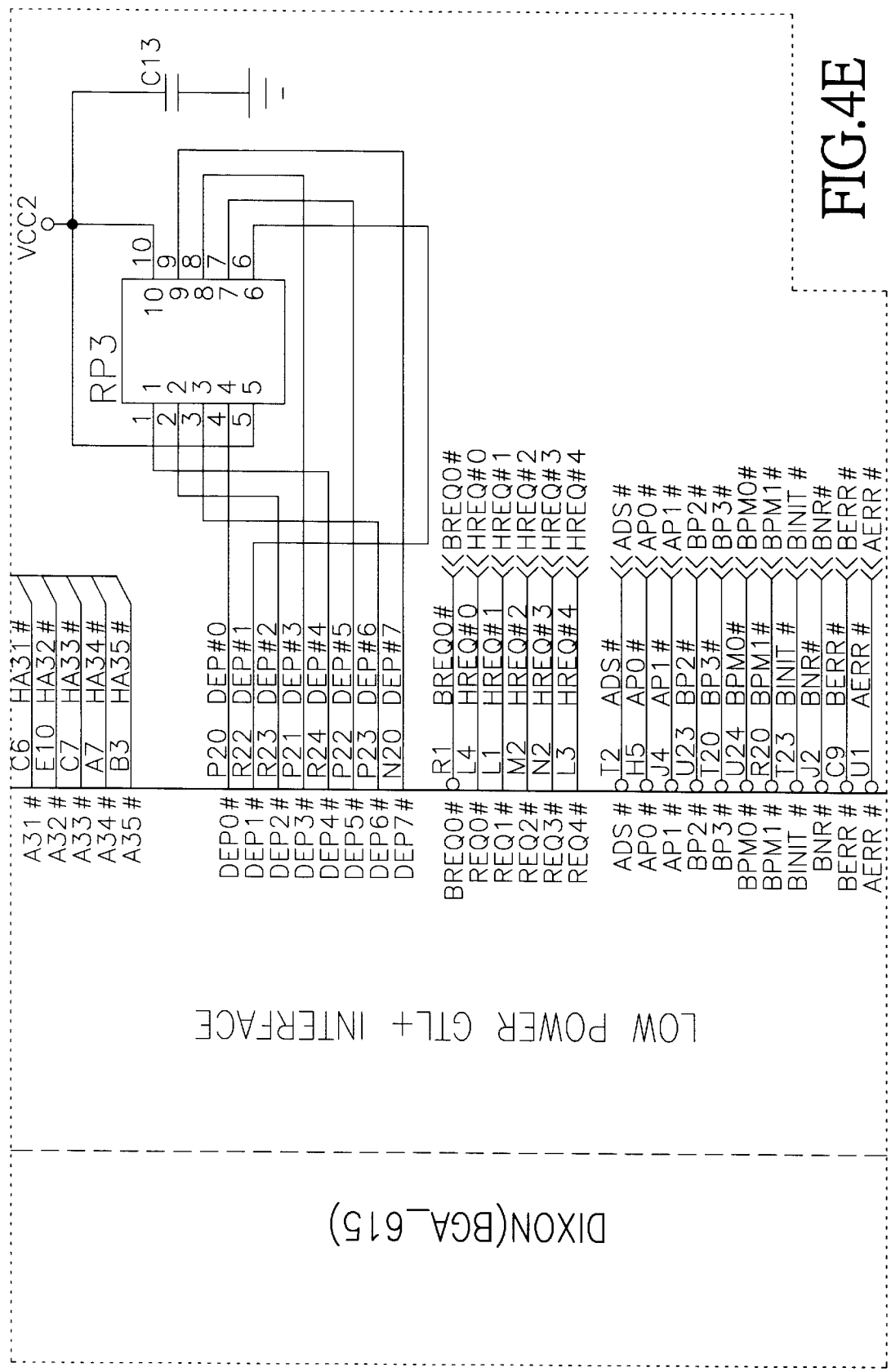
Figure 4F:
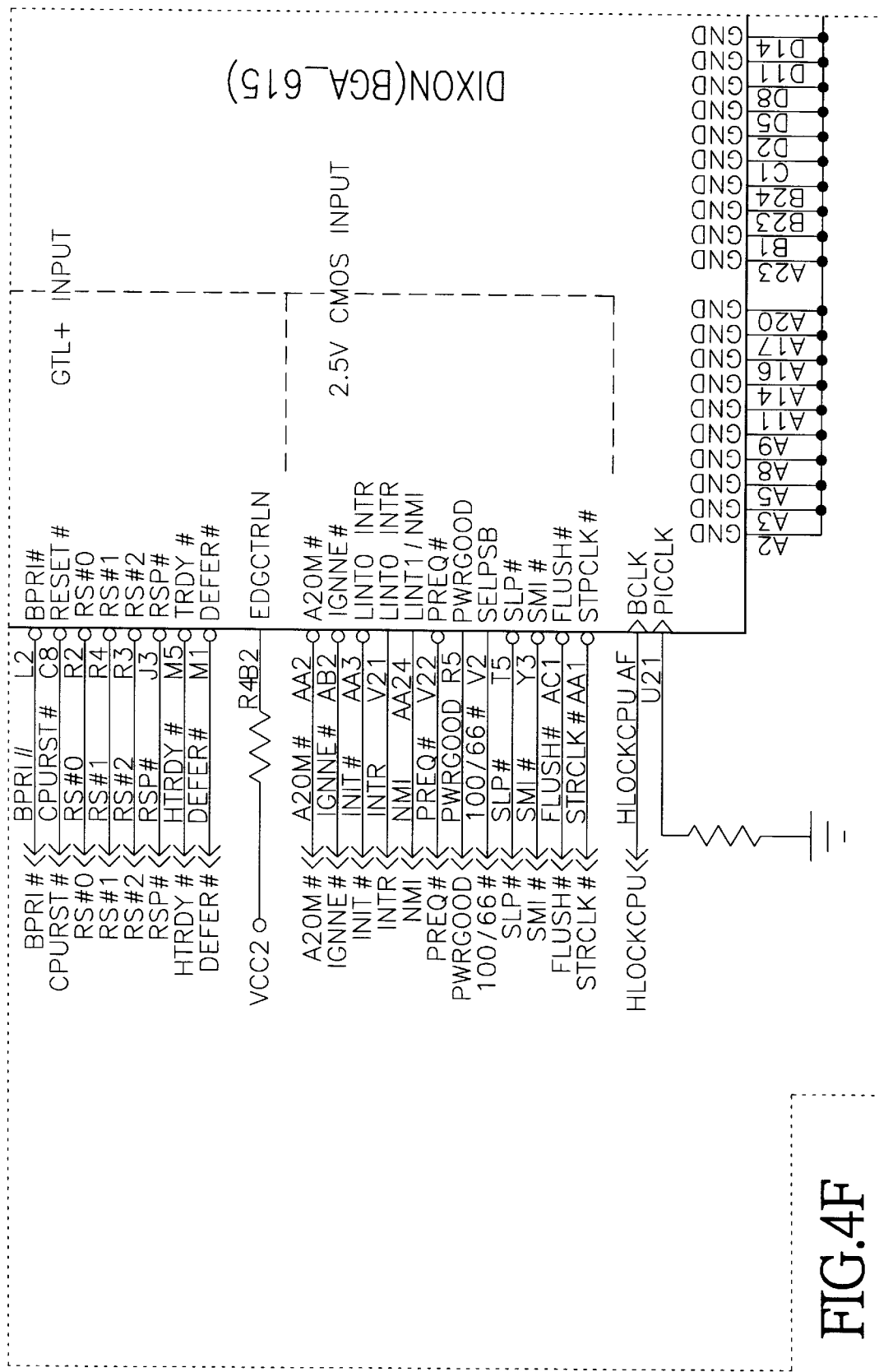
Figure 4G:
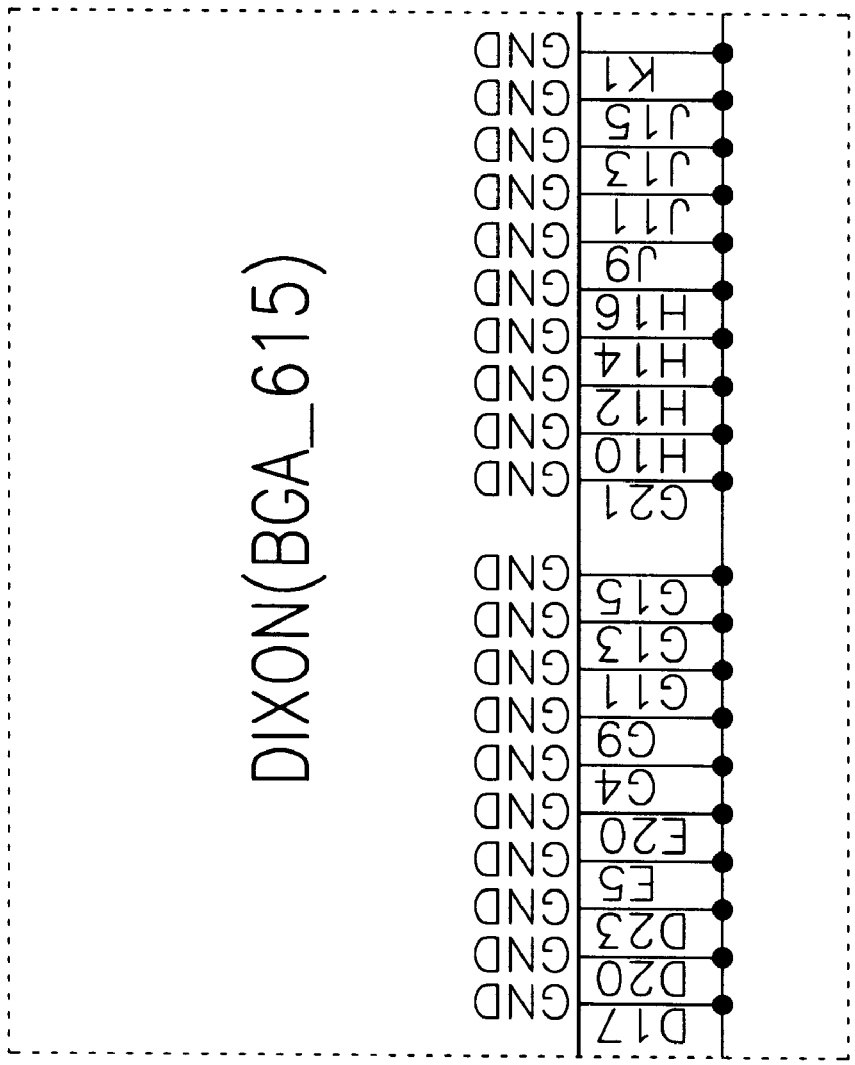
Figure 4H:
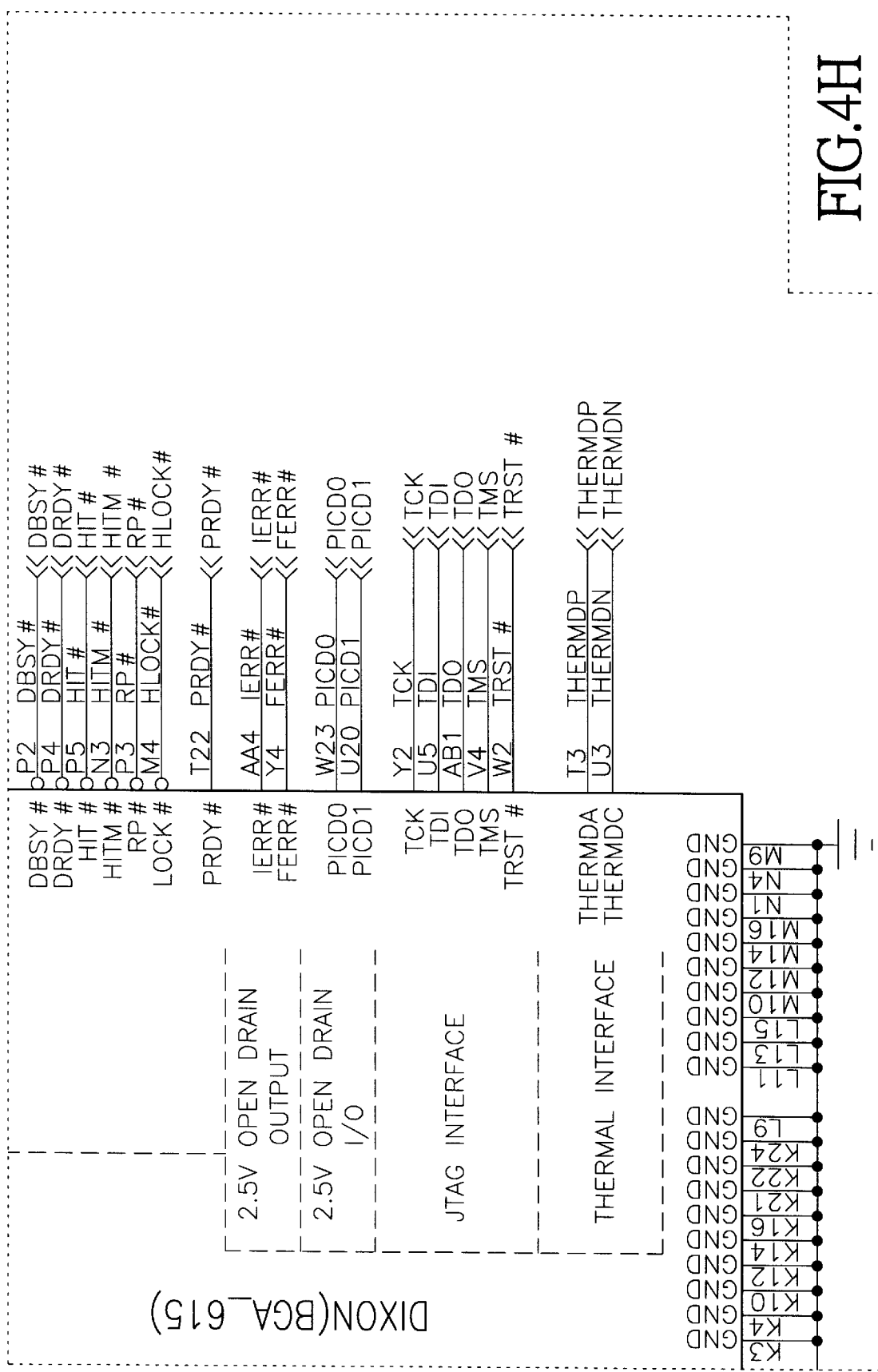
Figure 5C:
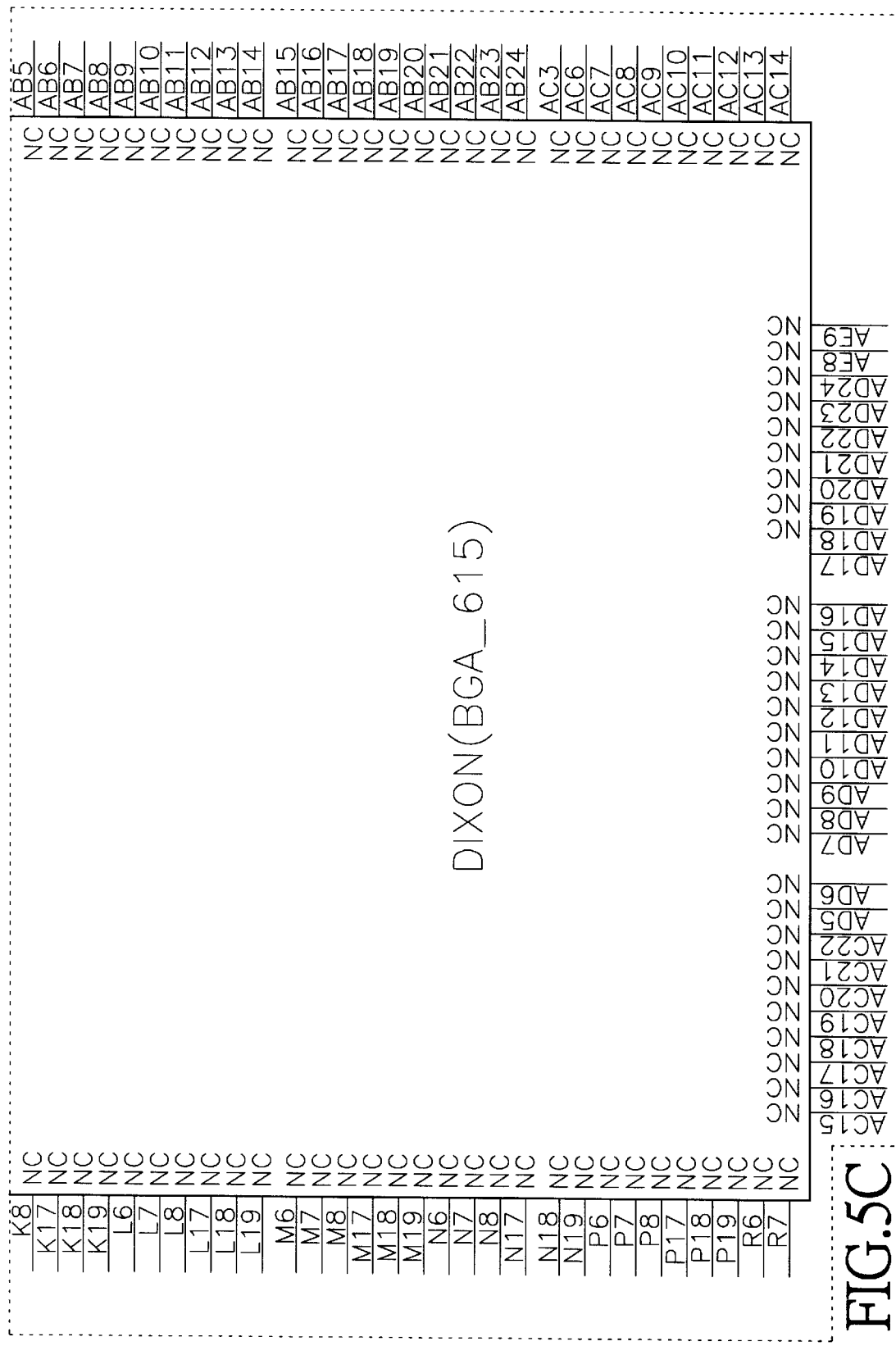
Figure 5D:
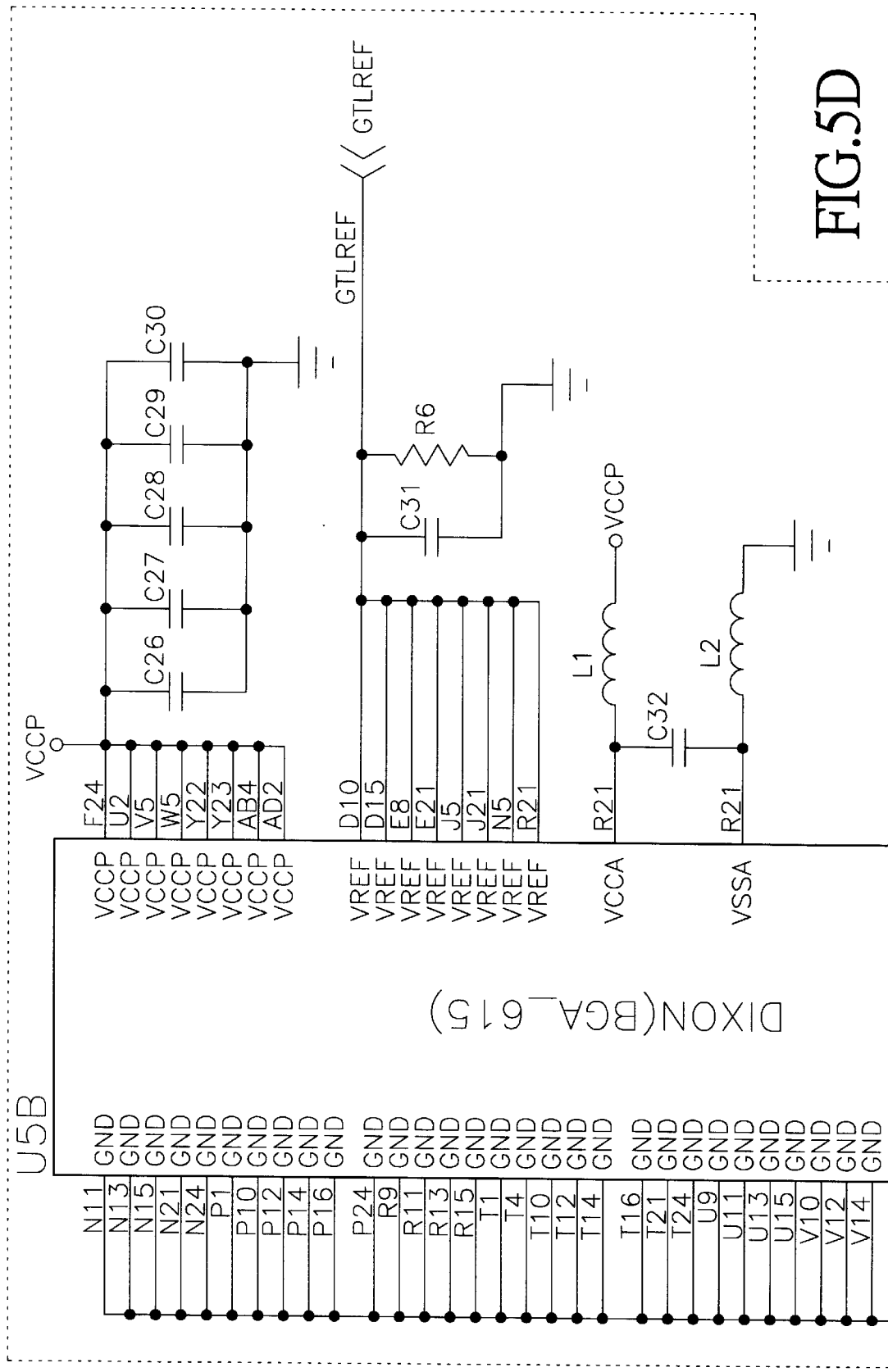
Figure 5E:
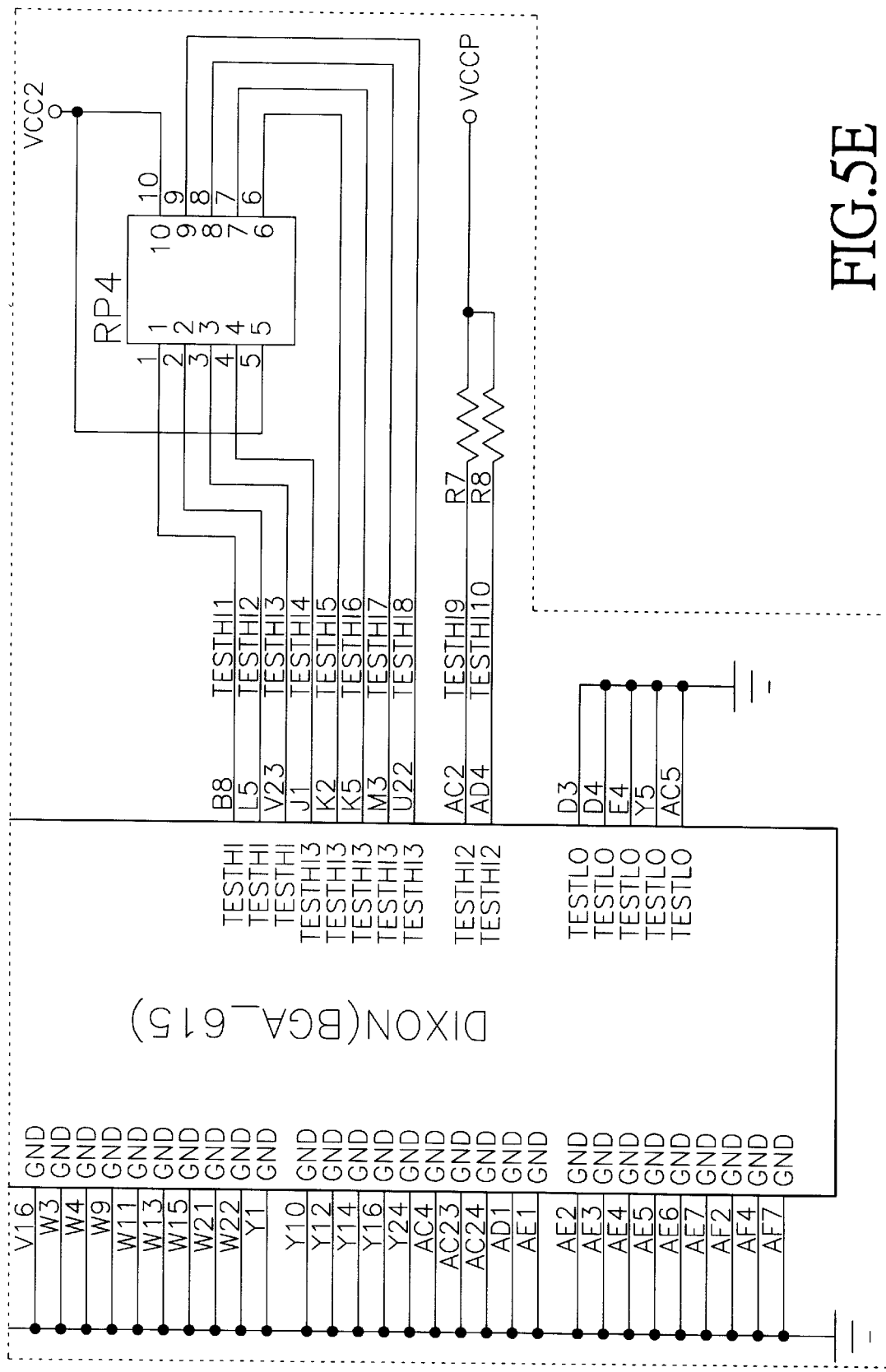
Figure 5F:
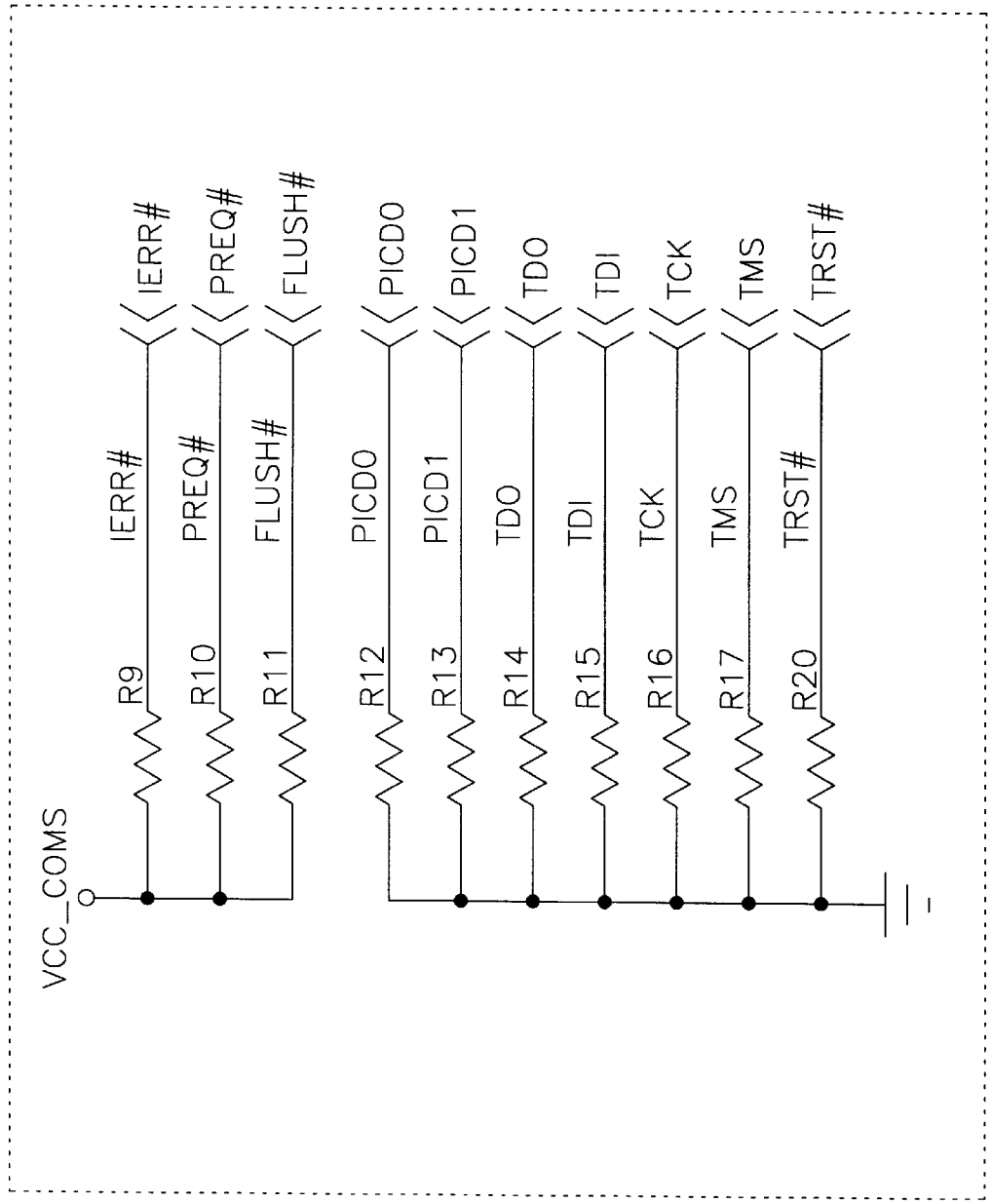
Figure 6:
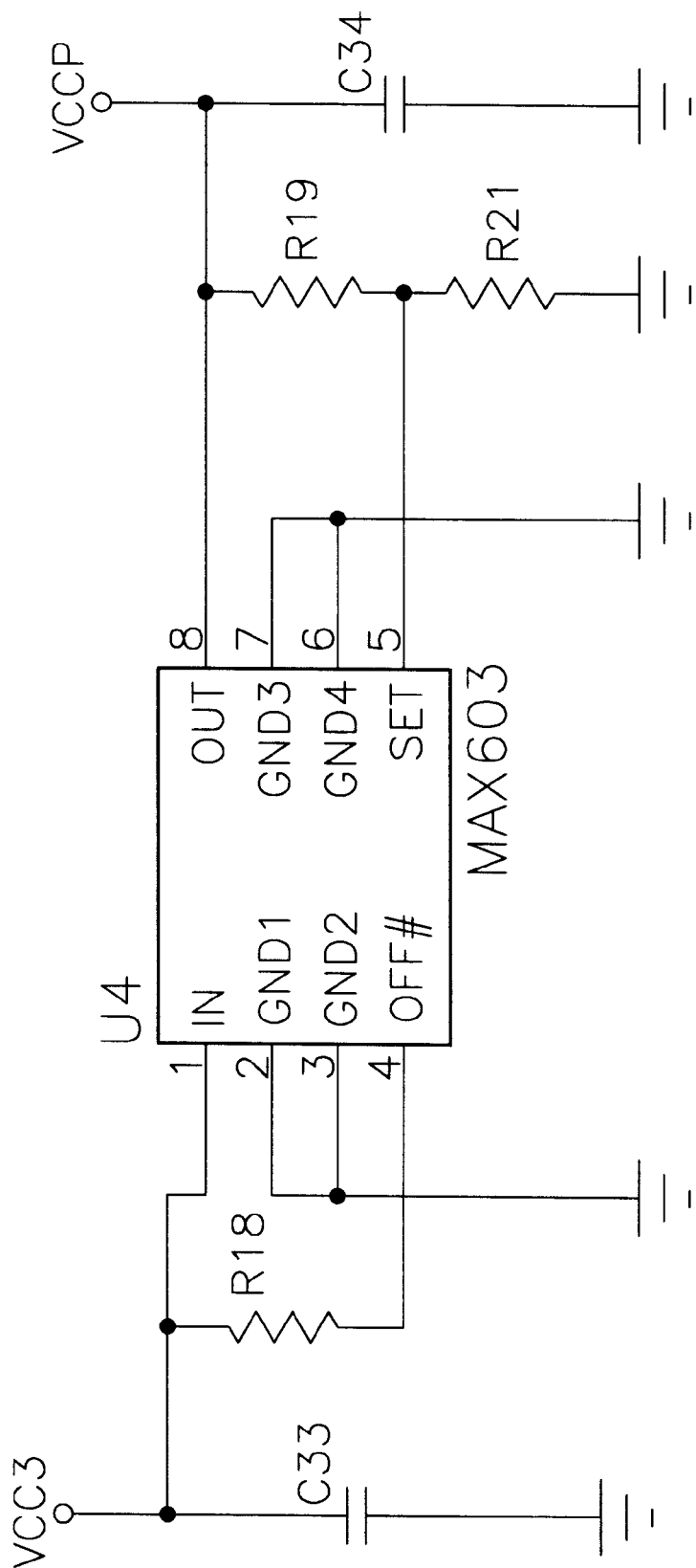
FIG. 6 is a circuit diagram of a voltage converter for a microprocessor adapter according to the present invention.

Referring to FIGS. from 1 through 6, a microprocessor and main board mounting arrangement is shown comprised of a computer main board 1, a socket 2, and a microprocessor adapter 3.

The socket 2 (a 370-pin PGA socket) is mounted on the main board 1 to hold the microprocessor adapter 3, enabling the circuit unit in the microprocessor adapter 3 to be electrically connected to the circuit unit in the computer main board 1.

The microprocessor adapter J is provided to hold a microprocessor 31, which is made by means of BGA (Ball Grid Array) techniques, and an integrated device comprised of IC US, U5B, U5C, resistors R9~R20, Capacitors C1~C30, Inductors L1, L2, . . . etc. The microprocessor 31 can be a Mobile Celeron CPU, Desktop Celeron CPU, or Mobile Pentium II CPU. The microprocessor adapter 3 comprises a voltage converter 32 formed of IC U4, capacitors C33 and C34, and resistors R18~R21. The voltage converter 32 converts the output power (1.6V) of the circuit unit in the computer main board 1 into 1.5V or 1.8V for the microprocessor 31.

As indicated above, the present invention enables a computer main board to simultaneously support Mobile Celeron CPU or Mobile Pentium II CPU, or Desktop Celeron CPU.

It is to be understood that the drawings are designed for purposes of illustration only, and are not intended for use as a definition of the limits and scope of the invention disclosed. For example, a plurality of sockets may be installed in the computer main board to hold a respective adapter and a respective microprocessor in each adapter.

What the invention claimed is:

1. A microprocessor and main board mounting arrangement comprising:

a computer main board;

at least one socket respectively mounted on said computer main board; and at least one microprocessor adapter respectively mounted on said at least one socket, each of said at least one microprocessor adapter including:
 (a) a microprocessor, wherein said microprocessor is soldered to said at least one microprocessor adapter for establishing an electrical connection therebetween;
 (b) a voltage converter for converting output power supply from said computer main board into a working voltage for the microprocessor at said at least one microprocessor adapter; and
 (c) an interface circuit assembled on said at least one microprocessor adapter, wherein said interface circuit transforms signals native to said microprocessor to signals native to said computer main board and vice-versa.

2. The microprocessor and main board mounting arrangement of claim 1 wherein the microprocessor at each of said at least one microprocessor adapter is packaged by means of BGA (Ball Grid Array) techniques.

3. The microprocessor and main board mounting arrangement of claim 1 wherein said at least one socket is a 370-pin Pin Grid Array Socket.

4. The microprocessor and main board mounting arrangement of claim 1 wherein the voltage converter at each of said at least one microprocessor adapter is a voltage regulator.

5. The microprocessor and main board mounting arrangement of claim 1 wherein the voltage converter at each of said at least one microprocessor adapter provides 1.5V DC power output to the respective microprocessor.

6. The microprocessor and main board mounting arrangement of claim 1 wherein the voltage converter at each of said at least one microprocessor adapter provides 1.8V DC power output to the respective microprocessor.

* * * * *